(12) United States Patent
Lee et al.

(10) Patent No.: US 6,333,251 B1
(45) Date of Patent: Dec. 25, 2001

(54) METHOD OF FABRICATING GATE STRUCTURE OF SEMICONDUCTOR DEVICE FOR REPAIRING DAMAGE TO GATE OXIDE LAYER

(75) Inventors: Eun-ha Lee, Suwon; Byung-chan Lee; Ho-kyu Kang, both of Sungnam, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/639,122

(22) Filed: Aug. 16, 2000

(30) Foreign Application Priority Data

Aug. 17, 1999 (KR) .................................. 99-33860

(51) Int. Cl.[7] .................... H01L 21/3205; H01L 21/4763
(52) U.S. Cl. ............................................ 438/595; 438/596
(58) Field of Search .................................. 438/595, 596, 438/305, 303, 304

(56) References Cited

U.S. PATENT DOCUMENTS

| | | | |
|---|---|---|---|
| 4,716,131 | * | 12/1987 | Okazawa et al. . |
| 5,238,859 | * | 8/1993 | Kamijo et al. . |
| 5,599,725 | * | 2/1997 | Dorleans et al. . |
| 5,710,054 | * | 1/1998 | Gardner et al. . |
| 5,736,455 | * | 4/1998 | Iyer et al. ............................ 438/592 |
| 5,756,365 | * | 5/1998 | Kakumu . |
| 5,804,499 | * | 9/1998 | Dehm et al. ......................... 438/592 |
| 5,877,058 | * | 3/1999 | Gardner et al. ..................... 438/304 |
| 6,124,170 | * | 9/2000 | Lim et al. ............................ 438/267 |
| 6,124,190 | * | 9/2000 | Yamamoto et al. ................. 438/592 |

* cited by examiner

Primary Examiner—Richard Booth
(74) Attorney, Agent, or Firm—Volentine Francos, PLLC

(57) ABSTRACT

A method of fabricating a gate of a semiconductor device, by which damage to a gate oxide layer is repaired, is provided. In an aspect of the method, a gate oxide layer is formed on a semiconductor substrate. A conductive layer containing silicon is formed on the gate oxide layer. A stacked structure with a polycrystalline silicon layer and a dichlorosilane-family tungsten silicide layer can be used as the conductive layer. A gate is formed by patterning the conductive layer. A silicon source layer which covers the sidewall of the gate is formed by selective epitaxial growth of silicon. The silicon source layer is grown to a thickness of about 200 Å or less. The silicon source layer is thermally treated at an oxidation atmosphere, thus repairing damage to the gate oxide layer.

31 Claims, 4 Drawing Sheets

METHOD OF FABRICATING GATE STRUCTURE OF SEMICONDUCTOR DEVICE FOR REPAIRING DAMAGE TO GATE OXIDE LAYER

BACKGROUND OF THE INVENTION

1. Field of the Invention

The present invention relates to a method of fabricating semiconductor devices, and more particularly, to a method of fabricating a gate for repairing damage to a gate oxide layer.

2. Description of the Related Art

With a demand for high-speed operation of semiconductor devices, a material having a higher conductance is used as an electrode which contacts a gate, a drain or a source. For example, a material such as silicide or metal is used as a gate or electrode as shown in U.S. Pat. No. 5,814,537 to Maa, et. al., entitled "Method of Forming Transistor Electrodes from Directionally Deposited Silicide", filed on Sep. 29, 1998, or U.S. Pat. No. 5,194,403 to Delage, et. al., entitled "Method for the Making of the Electrode Metalizations of a Transistor", filed on Apr. 16, 1993. Also, tungsten silicide $WSi_x$ can be used as a gate as in U.S. Pat. No. 5,804,499 to Dehm, et. al., entitled "Prevention of Abnormal Wsi.sub.x Oxidation by in-situ Amorphous Silicon Deposition", filed on Sep. 8, 1998. Also, this patent discloses protection of a tungsten silicide layer using an amorphous silicon layer to prevent oxidation of tungsten silicide.

Meanwhile, in order to form a gate, a process for patterning a conductive layer at a required scale is performed after a gate oxide layer and the conductive layer are deposited on a semiconductor substrate. In this patterning process, the gate oxide layer below the conductive layer can be damaged. Particularly, the edge of the gate oxide layer, that is, a portion adjacent to the sidewall of the patterned conductive layer, is damaged more than other portions. This damage can cause a degradation in the characteristics of a transistor, so that a thermal treatment process for repairing the damaged gate oxide layer is required.

However, the thermal treatment may cause a defect within a gate. For example, as shown in FIG. 1, a defect such as a cavity or void 37 may be formed within a gate which comprises polycrystalline silicon layer 31/tungsten silicide layer 35.

To be more specific, a gate oxide layer 20 is deposited on a semiconductor substrate 10, and the polycrystalline silicon layer 31 and the tungsten silicide layer 35 are sequentially formed and patterned by dry etching. At this time, the gate oxide layer 20 under the polycrystalline silicon layer 31 is eroded and damaged by the dry etching. In order to repair this damage to the gate oxide layer 20, a thermal treatment with an oxidation atmosphere is performed. During the thermal treatment, the sidewall surfaces of the patterned polycrystalline silicon layer 31 and tungsten silicide layer 35 can be oxidized, resulting in a silicon oxide layer 20'. Accordingly, the damage to the gate oxide layer 20 is repaired, particularly damage to the edge thereof adjacent to the sidewall of the patterned polycrystalline silicon layer 31.

In the tungsten silicide layer 35, a supply of silicon in this thermal treatment is accomplished by consumption of excessive silicon contained in the tungsten silicide layer 35 itself. However, the amount of the excessive silicon is limited, so that the tungsten silicide layer 35 acts as a silicon supply source only in the early stage of thermal treatment. As thermal treatment progresses, silicon required by oxidation is provided from the polycrystalline silicon layer 31 below the tungsten silicide layer 35.

That is, silicon contained in the polycrystalline silicon layer 31 moves into the tungsten silicide layer 35 or to the surface thereof due to diffusion or the like, and is consumed for oxidation. This movement of silicon may generate cavity 37 within the polycrystalline silicon layer 31. Consequently, the generation of the cavity 37 deteriorates the operational characteristics of a transistor.

In particular, when dichlorosilane $SiH_2Cl_2$ (hereinafter referred to as "DCS") is used as a source gas used for depositing the tungsten silicide layer 35 in order to reduce the content of fluorine (F) in the tungsten silicide layer 35, the generation of the cavity 37 becomes serious. When the tungsten silicide layer is formed of DCS or the like, a very small amount of chlorine (Cl) remains within the tungsten silicide layer 35. Chlorine (Cl) helps diffuse silicon, thus increasing the mobility of silicon from the polycrystalline silicon layer 31.

SUMMARY OF THE INVENTION

An object of the present invention is to provide a method of fabricating a gate of a semiconductor device, by which a defect such as cavities is prevented from being generated in the gate, and damage to a gate oxide layer can be repaired.

To achieve the above object of the invention, in an aspect of a method for fabricating a gate of a semiconductor device, a gate oxide layer is formed on a semiconductor substrate. A conductive layer containing silicon is formed on the gate oxide layer. A stacked structure with a polycrystalline silicon layer and a tungsten silicide layer can be used as the conductive layer. Here, the tungsten silicide layer is deposited on the polycrystalline silicon layer using a reaction gas containing dichlorosilane and tungsten fluoride.

Next, an etch mask for selectively exposing a portion of the conductive layer is formed on the conductive layer, and a gate is formed by etching the exposed portion of the conductive layer. A silicon source layer which covers the sidewall of the gate is formed by selective epitaxial growth of silicon. The silicon source layer is grown to a thickness of about 200 Å or less. The silicon source layer is thermally treated in an oxidation atmosphere, thus repairing damage to the gate oxide layer.

According to the present invention, thermal treatment having an oxidation atmosphere for recovering a gate oxide layer prevents a defect such as cavities from being generated within a polycrystalline silicon layer below a tungsten silicide layer.

BRIEF DESCRIPTION OF THE ATTACHED DRAWINGS

The above objective and advantages of the present invention will become more apparent by describing in detail preferred embodiments thereof with reference to the attached drawings in which.

DETAILED DESCRIPTION OF PREFERRED EMBODIMENTS

Figure 1:
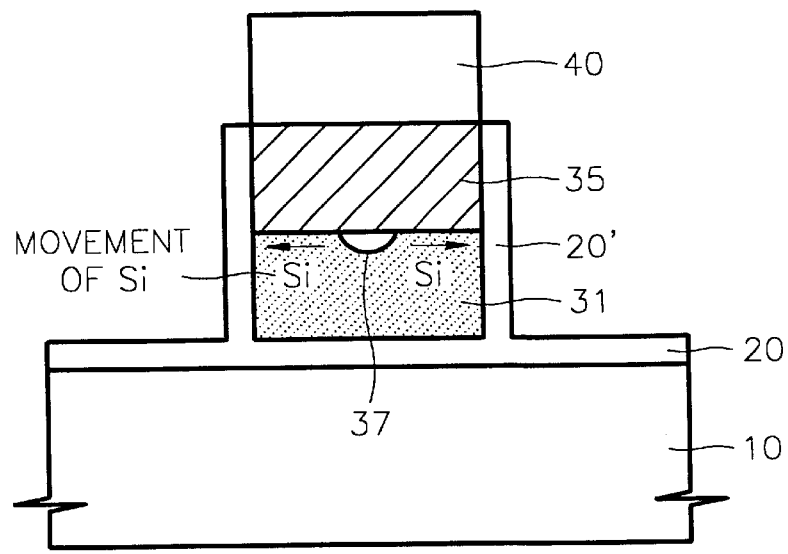
FIG. 1 is a cross-sectional view schematically illustrating a conventional method of fabricating a gate of a semiconductor device.

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Figure 2:
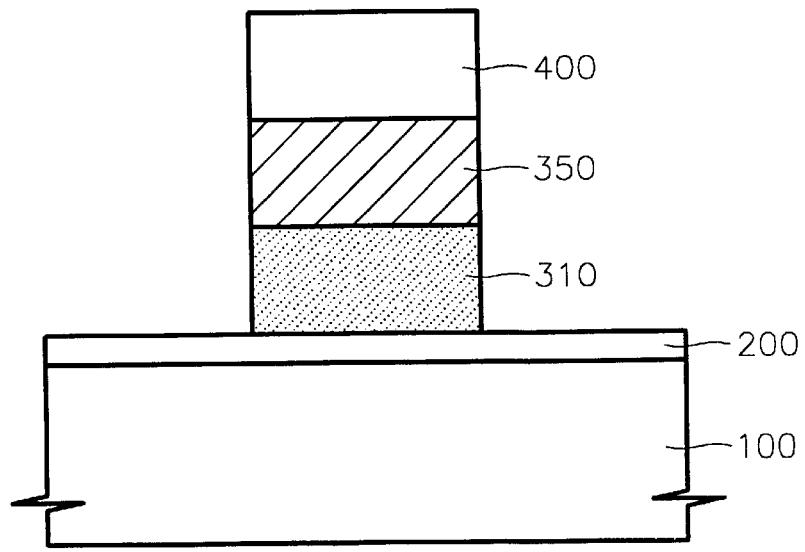
FIGS. 2 through 4 are cross-sectional views illustrating a method of fabricating a gate of a semiconductor device, according to a first embodiment of the present invention.
Figure 3:
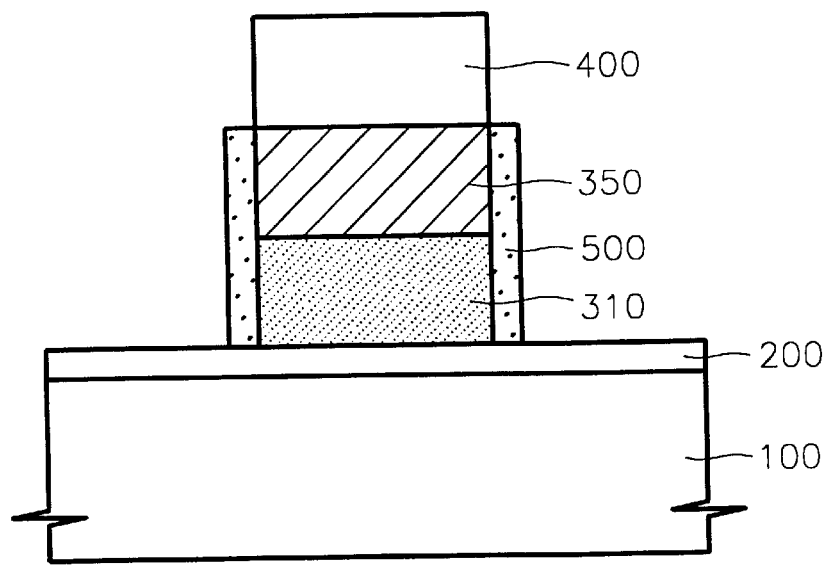
Figure 4:
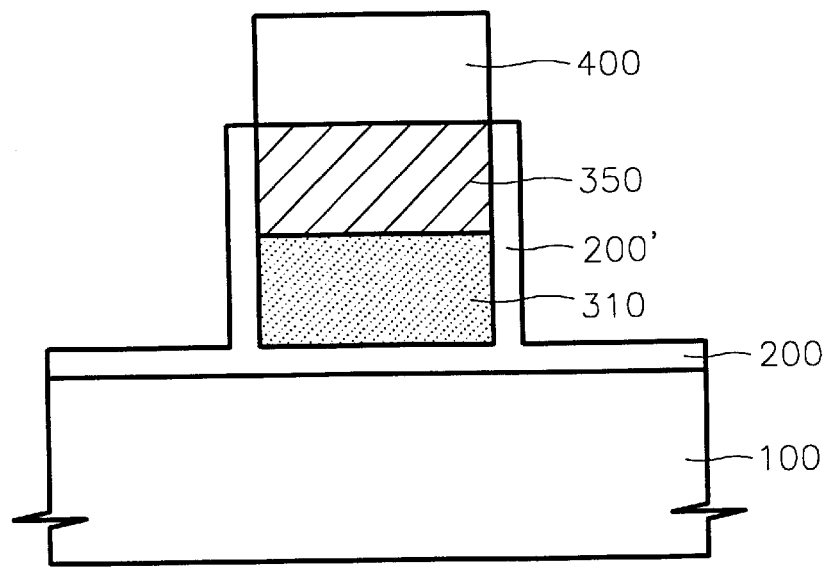

FIGS. 2 through 4 are cross-sectional views illustrating a method of fabricating a gate of a semiconductor device, according to a first embodiment of the present invention.

FIG. 2 shows forming gates 310 and 350 on a semiconductor substrate 100. To be more specific, a gate oxide layer 200 is formed on the semiconductor substrate 100 made of silicon (Si) atoms or the like. The gate oxide layer 200 can be formed by oxidizing the exposed surface of the semiconductor substrate 100. Conductive layers 310 and 350 to be used as a gate are formed of a material containing silicon, on the gate oxide layer 200.

For example, a polycrystalline silicon layer 310 doped with impurities, and a metal (preferably tungsten) silicide layer are sequentially formed on the gate oxide layer 200. The tungsten silicide layer 350 can be formed by several known methods, but is preferably formed by a deposition method in which DCS or the like is used as a silicon source.

For example, it is preferable that a DCS-family tungsten silicide layer 350 is used which is formed by chemical vapor deposition (CVD) in which DCS is used as a silicon source, and tungsten fluoride such as tungsten hexafluoride ($WF_6$) is used as a tungsten source.

The content of fluorine remaining in DCS-family tungsten silicide layer 350 can be minimized, so that the DCS-family tungsten silicide layer is resistant to erosion. Also, the DCS-family tungsten silicide layer 350 has improved step coverage, low post-annealed stress, and high adhesion, as compared to a general tungsten silicide layer which is formed using silane.

Thereafter, an etch mask 400 is formed on the tungsten silicide layer 350. Here, it is preferable that the etch mask 400 is formed by photolithography and of an insulating material to be used in a subsequent process for forming an interlayer insulative layer. For example, the etch mask 400 can be a silicon oxide ($SiO_2$) layer, a silicon nitride (SiN) layer, or a multi-layered structure with a silicon oxide layer/silicon nitride layer.

The etch mask 400 selectively exposes the surface of the tungsten silicide layer 350 therebelow using photolithography. The tungsten silicide layer 350 exposed by the etch mask 400 is etched by dry etching. This etching continues until the gate oxide layer 200 under the tungsten silicide layer 350 is exposed, resulting in a gate (310+350) comprised of the patterned tungsten silicide layer 350 and the patterned polycrystalline silicon layer 310.

An etching process for patterning the gate (310+350) inevitably causes damage to the gate oxide layer 200 under the gate. That is, a preset amount of over etching is performed after the aforementioned etching, so that part of the gate oxide layer 200 is etched, causing damage to the gate oxide layer 200.

FIG. 3 shows forming a silicon source layer 500 which covers the sidewall of the gate (310+350). To be more specific, the silicon source layer 500 is formed, which covers the exposed sidewalls of the patterned polycrystalline silicon layer 310 and the patterned tungsten silicide layer 350 which forms the gate (310+350). At this time, selective epitaxial growth is performed so that the silicon source layer 500 is formed on selected exposed sidewalls. A silicon layer is selectively epitaxial-grown so that it is not grown on the silicon oxide of the gate oxide layer 200 and the silicon oxide or silicon nitride of the etch mask 400.

For example, the silicon source layer 500 can be selectively epitaxial-grown by ultra high vacuum CVD (UHV CVD). Here, disilicon hexachloride gas ($Si_2Cl_6$) can be used as a silicon source gas, and a chlorine gas $Cl_2$ can be added to improve the selectivity of growth. The growth of the silicon source layer 500 by UHV CVD is performed at a pressure between about $10^{-4}$ Torr and $10^{-2}$ Torr. In this condition, the silicon source layer 500 can be selectively epitaxial-grown at a temperature between about 600° C. and 750° C.

Alternatively, the silicon source layer 500 can be selectively epitaxial-grown by low pressure CVD (LP CVD) which is conducted at a pressure between about 10 Torr and 80 Torr. Here, the silicon source layer 500 can be epitaxial-grown using DCS and a silicon source gas containing a hydrochloric acid gas (HCl) and a hydrogen gas ($H_2$) at a temperature between about 750° C. and 950° C. Preferably, the silicon source layer 500 can be epitaxial-grown at about 850° C.

In this epitaxial growth condition, silicon is not substantially grown on a silicon oxide layer or a silicon nitride layer, but is substantially grown on a silicon layer, a polycrystalline silicon layer or a silicide layer.

Accordingly, a silicon layer is selectively grown on only the sidewall of the polycrystalline silicon layer 310 and the sidewall of the tungsten silicide layer 350, thus forming the silicon source layer 500. The gate oxide layer 200 or the etch mask 400 is formed of silicon oxide or the like, and thus acts as a selection mask which enables the selective epitaxial growth.

The silicon source layer 500 is selectively grown to a thickness of about 200 Å or less. The silicon source layer 500 is used as supplying means for providing silicon during thermal treatment with an oxygen atmosphere for recovering the gate oxide layer 200. Thus, the thickness of the silicon source layer 500 is sufficient if it is thick enough to supply silicon which is required by oxidation to repair the damage to the gate oxide layer 200. Accordingly, the silicon source layer 500 can be formed to various different thicknesses according to the type of semiconductor device or the thickness of the gate oxide layer 200 adopted. The silicon source layer 500 is preferably formed to a thickness between about 20 Å and 100 Å.

FIG. 4 schematically illustrates repairing the damage to the gate oxide layer 200. To be more specific, thermal treatment such as annealing is performed in an oxygen atmosphere using a dried oxygen gas ($O_2$). The gate oxide layer 200 which has been damaged is regrown by the thermal treatment, and the damage to the gate oxide layer 200 is thus repaired. The silicon source layer 500 of FIG. 3 covering the sidewalls of the gate (310+350) is oxidated and changed into a silicon oxide layer 200'.

When the sidewall surfaces of the polycrystalline silicon layer 310 and tungsten silicon layer 350 are exposed in the thermal treatment of the oxygen atmosphere, they may be oxidated. Silicon consumed for such an oxidation may be required to be diffused, thus generating the cavity 37 of FIG. 1 within the polycrystalline silicon layer 31 of FIG. 1, as described above referring to FIG. 1.

However, in the first embodiment of the present invention, oxidation can occur in only the silicon source layer 500. That is, silicon required for oxidation may be provided from the silicon source layer 500. Hence, the silicon within the polycrystalline silicon layer 310 or tungsten silicide layer 350 does not need to move out or diffuse out therefrom. This can prevent the cavity 37 (see FIG. 1) or the like from being generated within the polycrystalline silicon layer 31 (see FIG. 1) by the above-described thermal treatment.

As described above, in the first embodiment, generation of a defect such as cavities within the polycrystalline silicon layer 310 below the tungsten silicide layer 350 is prevented, and the damage to the gate oxide layer 200 can be repaired. In particular, when the tungsten silicide layer 350 for the gate (310+350) is formed of DCS-family tungsten silicide having superior characteristics to a general tungsten silicide, the generation of cavities or the like can be prevented.

A general semiconductor device fabrication process, for example, a process for forming spacer (not shown) or the like, can be sequentially performed after the gate oxide layer 200 is recovered as described above.

Figure 5:
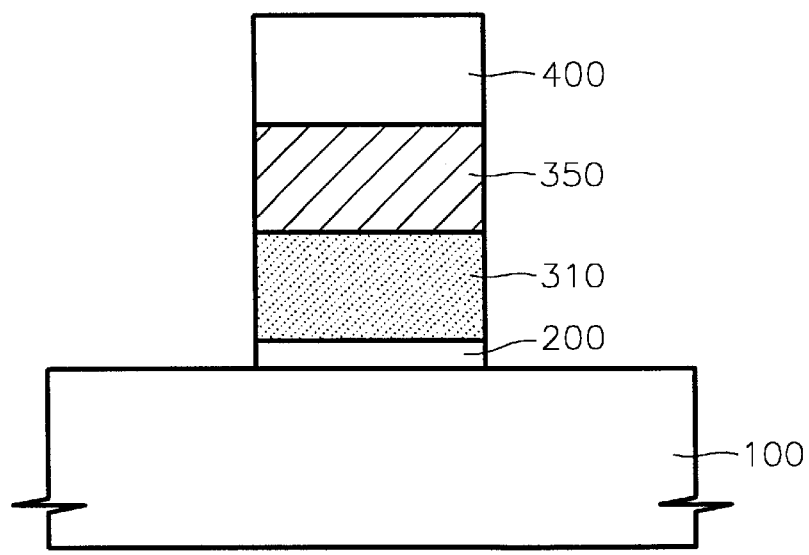
FIGS. 5 through 7 are cross-sectional views schematically illustrating a method of fabricating a gate of a semiconductor device, according to a second embodiment of the present invention.
Figure 6:
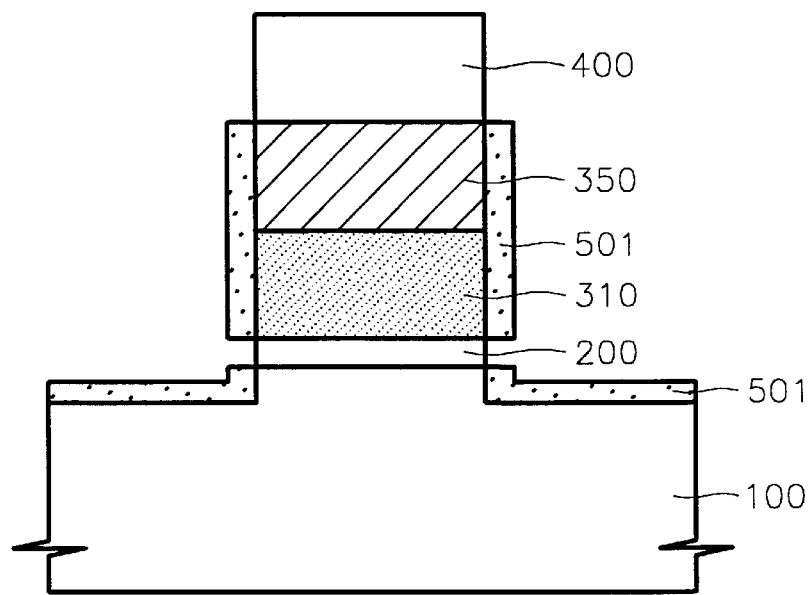
Figure 7:
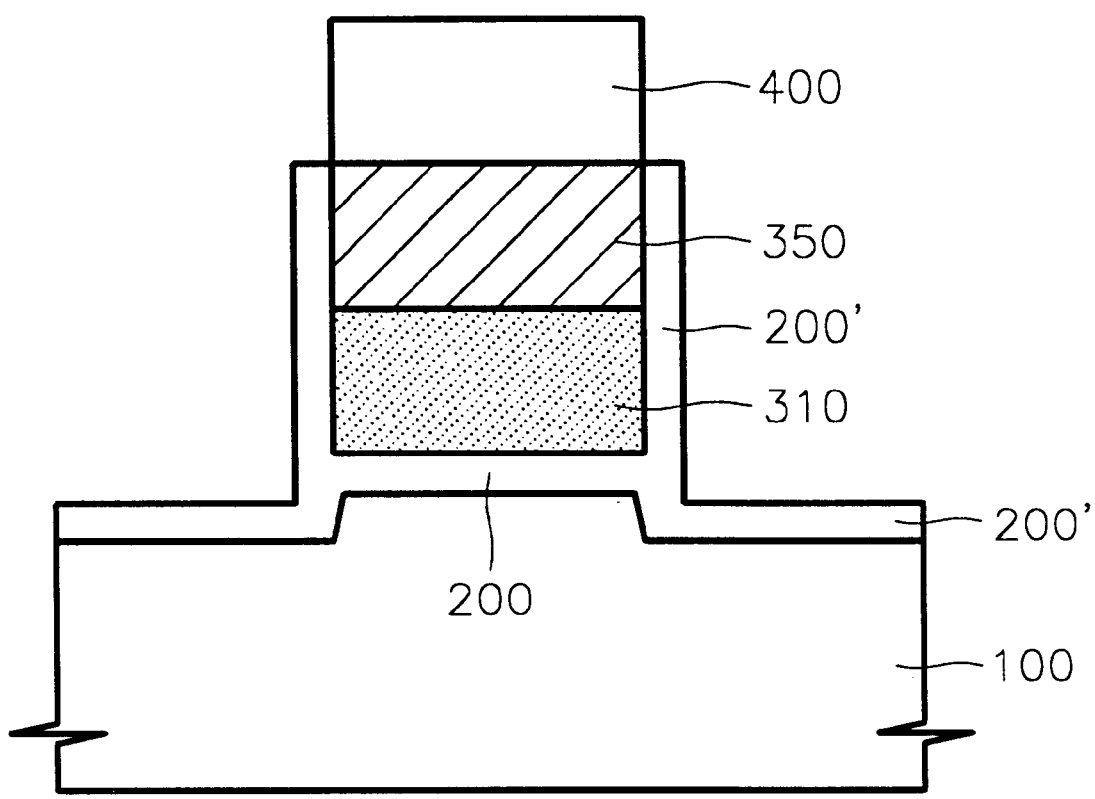

FIGS. 5 through 7 are cross-sectional views schematically illustrating a method of fabricating a gate of a semiconductor device, according to a second embodiment of the present invention. In contrast with the first embodiment, in the second embodiment, over etching is performed until the surface of the semiconductor substrate 100 below the gate oxide layer 200 is exposed, in a patterning process for forming the gate (310+350). The same reference numerals in the second embodiment as those in the first embodiment denote the same elements.

FIG. 5 schematically illustrates over etching the gate oxide layer 200 on the semiconductor substrate 100. To be more specific, as described above referring to FIG. 2 in the first embodiment, the polycrystalline silicon layer 310 and the tungsten silicide layer 350 are sequentially formed on the gate oxide layer 200. Here, it is preferable that the tungsten silicide layer 350 is formed of DCS-family tungsten silicide. Next, as shown in FIG. 2, a part of the tungsten silicide layer 350 exposed by the etch mask 400 is etched. The etching continues until the polycrystalline silicon layer 310 below the tungsten silicide layer 350 is sequentially etched.

This selective etching results in a gate (310+350). Following this, the etching continues, that is, over etching is performed, to etch the gate oxide layer 200 selectively exposed, thereby exposing the surface of the semiconductor substrate 100 therebelow. Here, the surface of the semiconductor substrate 100 can be recessed to a preset depth. Therefore, all of the gate oxide layer 200 but a portion covered by the etch mask 400 is etched out.

FIG. 6 schematically illustrates forming a silicon source layer 501 which selectively covers the sidewall of the exposed gate (310+350) and the semiconductor substrate 100. To be more specific, the silicon source layer 501 is formed which covers only the sidewalls of a polycrystalline silicon layer 310 pattern and a tungsten silicide layer 350 pattern which form the gate (310+350), and the semiconductor substrate 100 recessed and exposed. Here, the silicon source layer 501 is formed by selectively epitaxial-growing silicon, as described above referring to FIG. 3.

Accordingly, the silicon source layer 501 can be selectively grown on only the exposed semiconductor substrate 100 and the sidewall surfaces of the exposed polycrystalline silicon layer 310 and tungsten silicide layer 350. The silicon source layer 501 exposes the sidewall of the gate oxide layer 200 due to the selective epitaxial growth.

The silicon source layer 501 selectively grown as described above varies with the conditions of thermal treatment of oxidation atmosphere which is subsequently performed, but is grown to a thickness of about 200 Å or less. At this time, a portion of the silicon source layer 501 which covers the semiconductor substrate 100 acts as the gate oxide layer 200 in the future, so that it is formed to a thickness corresponding to the thickness of the gate oxide layer 200. Preferably, the silicon source layer 501 is formed to a thickness between about 20 Å and 100 Å.

FIG. 7 schematically illustrates repairing damage to the gate oxide layer 200. To be more specific, thermal treatment for oxidating the silicon source layer 501 is performed as described above referring to FIG. 4. The gate oxide layer which has been damaged is regrown by this thermal treatment. The silicon source layer 501 (see FIG. 6) is oxidated and converted into a silicon oxide layer 200'. Accordingly, a portion of the silicon oxide layer 200' which covers the semiconductor substrate 100 extends from the gate oxide layer 200. Hence, it is preferable that the thermal treatment is performed so that the silicon oxide layer 200' is completely oxidized.

As described above, silicon required for forming the silicon oxide layer 200' is provided from the silicon source layer 501 itself, thus preventing silicon from moving out from the polycrystalline silicon layer 310 below the tungsten silicide layer 350, the two layers forming a gate (310+350). Hence, generation of a defect such as cavities within the polycrystalline silicon layer 310 is prevented, and damage to the gate oxide layer 200 can be repaired. In particular, when the tungsten silicide layer 350 of the gate (310+350) is formed of DCS-family tungsten silicide having superior characteristics to a general tungsten silicide, the generation of cavities or the like can be prevented.

A general semiconductor device fabrication process, for example, a process for forming spacer (not shown) or the like, can be sequentially performed after the gate oxide layer 200 is recovered as described above.

Although the invention has been described with reference to a particular embodiment, it will be apparent to one of ordinary skill in the art that modifications of the described embodiment may be made without departing from the spirit and scope of the invention.

What is claimed is:

1. A method of fabricating a gate of a semiconductor device, comprising:

forming a gate oxide layer on a semiconductor substrate;

forming a conductive layer containing silicon on the gate oxide layer;

forming a gate by etching the conductive layer;

forming a silicon source layer which covers an exposed sidewall of the gate; and repairing damage to the gate oxide layer by thermally treating the silicon source layer in an oxidation atmosphere.

2. The method of claim 1, wherein said forming the conductive layer comprises:

forming a polycrystalline silicon layer on the gate oxide layer; and forming a metal silicide layer on the polycrystalline silicon layer.

3. The method of claim 2, wherein in forming the metal silicide layer, a tungsten silicide layer is deposited on the polycrystalline silicon layer using a reaction gas containing dichlorosilane and tungsten fluoride.

4. A method of fabricating a gate of a semiconductor device, the method comprising:

forming a gate oxide layer on a semiconductor substrate;

forming a conductive layer containing silicon on the gate oxide layer, forming a gate by etching the conductive layer;

forming a silicon source layer which covers an exposed sidewall of the gate; and repairing damage to the gate oxide layer by thermally treating the silicon source layer in an oxidation atmosphere, wherein the silicon source layer is formed by selectively epitaxial-growing silicon on the exposed sidewall of the gate.

5. The method of claim 4, wherein the selective epitaxial growth of silicon is performed at a pressure between about $10^{-4}$ Torr and $10^{-2}$ Torr using a silicon source gas containing a disilicon hexachloride gas at a temperature between about 600° C. and 750° C.

6. The method of claim 4, wherein the selective epitaxial growth of silicon is performed at a pressure between about 10 Torr and 80 Torr using a silicon source gas containing dichlorosilane, a hydrochloric acid gas, and a hydrogen gas at a temperature between about 750° C. and 950° C.

7. The method of claim 1, wherein the silicon source layer is formed to a thickness of about 200 Å or less.

8. The method of claim 7, wherein the silicon source layer is formed to a thickness between about 20 Å and 100 Å.

9. The method of claim 1, wherein in forming the gate, the conductive layer is anisotropically etched until the semiconductor substrate below the gate oxide layer is exposed.

10. A method of fabricating a gate of a semiconductor device, the method comprising:

forming a gate oxide layer on a semiconductor substrate;

forming a conductive layer containing silicon on the gate oxide layer;

forming a gate by etching the conductive layer;

forming a silicon source layer which covers an exposed sidewall of the gate; and repairing damage to the gate oxide layer by thermally treating the silicon source layer in an oxidation atmosphere, wherein in forming the gate, the conductive layer is anisotropically etched until the gate oxide layer is exposed, and wherein the silicon source layer is selectively epitaxial-grown from the semiconductor substrate exposed.

11. A method of fabricating a gate of a semiconductor device, comprising:

forming a gate oxide layer on a semiconductor substrate;

sequentially forming a polycrystalline silicon layer and a tungsten silicide layer on the gate oxide layer;

forming a gate by sequentially etching the tungsten silicide layer and the polycrystalline silicon layer;

forming a silicon source layer which covers a sidewall of the gate; and repairing damage to the gate oxide layer by thermally treating the silicon source layer in an oxidation atmosphere.

12. The method of claim 11, wherein the tungsten silicide layer is formed on the polycrystalline silicon layer using a reaction gas containing dichlorosilane and tungsten fluoride.

13. A method of fabricating a gate of a semiconductor device, the method comprising:

forming a gate oxide layer on a semiconductor substrate;

sequentially forming a polycrystalline silicon layer and a tungsten silicide layer on the gate oxide layer;

forming a gate by sequentially etching the tungsten silicide layer and the polycrystalline silicon layer;

forming a silicon source layer which covers a sidewall of the gate; and repairing damage to the gate oxide layer by thermally treating the silicon source layer in an oxidation atmosphere, wherein the silicon source layer is formed by selectively epitaxial-growing silicon on the sidewall of the gate.

14. The method of claim 13, wherein the selective epitaxial growth of silicon is performed at a pressure between about $10^{-4}$ Torr and $10^{-2}$ Torr using a silicon source gas containing a disilicon hexachloride gas at a temperature between about 600° C. and 750° C.

15. The method of claim 13, wherein the selective epitaxial growth of silicon is performed at a pressure between about 10 Torr and 80 Torr using a silicon source gas containing dichlorosilane, a hydrochloric acid gas, and a hydrogen gas at a temperature between about 750° C. and 950° C.

16. The method of claim 11, wherein the silicon source layer is formed to a thickness of about 200 Å or less.

17. The method of claim 16, wherein the silicon source layer is formed to a thickness between about 20 Å and 100 Å.

18. The method of claim 11, wherein in the step of forming the gate, the tungsten silicide layer and the polycrystalline silicon layer are anisotropically etched until the semiconductor substrate below the gate oxide layer is exposed.

19. A method of fabricating a gate of a semiconductor device, the method comprising:

forming a gate oxide layer on a semiconductor substrate;

sequentially forming a polycrystalline silicon layer and a tungsten silicide layer on the gate oxide layer;

forming a gate by sequentially etching the tungsten silicide layer and the polycrystalline silicon layer;

forming a silicon source layer which covers a sidewall of the gate; and repairing damage to the gate oxide layer by thermally treating the silicon source layer in an oxidation atmosphere, wherein in forming the gate, the tungsten silicide layer and the polycrystalline silicon layer are anisotropically etched until the gate oxide layer is exposed, and wherein the silicon source layer is selectively epitaxial-grown from the semiconductor substrate exposed.

20. A method of fabricating a gate of a semiconductor device, the method comprising:

forming a gate oxide layer on a semiconductor substrate;

forming a gate containing silicon on the gate oxide layer;

forming a silicon source layer on an exposed sidewall of the gate; and not forming the silicon source layer on an exposed sidewall of the gate oxide;

wherein the silicon source layer is formed by epitaxial-growing silicon on the exposed sidewall of the gate.

21. A method of fabricating a gate of a semiconductor device, the method comprising:

forming a gate oxide layer on a semiconductor substrate;

forming a gate containing silicon on the gate oxide layer;

forming a silicon source layer on an exposed sidewall of the gate; and not forming the silicon source layer on an exposed sidewall of the gate oxide;

repairing damage to the gate oxide layer by thermally treating the silicon source layer in an oxidation atmosphere.

22. The method of claim 20, wherein forming the gate further comprises:

forming a conductive layer containing silicon on the gate oxide layer; and etching the conductive layer.

23. The method of claim 22, wherein forming the conductive layer further comprises:

forming a polycrystalline silicon layer on the gate oxide layer; and forming a metal silicide layer on the polycrystalline silicon layer.

24. The method of claim 23, wherein in forming the metal silicide layer, a tungsten silicide layer is deposited on the polycrystalline silicon layer using a reaction gas containing dichlorosilane and tungsten fluoride.

25. The method of claim 20, wherein the epitaxial-growing of silicon is performed at pressure between about $10^{-4}$ Torr and about $10^{-2}$ Torr using a silicon source gas containing a disilicon hexachloride gas at a temperature between about 600° C. and about 750° C.

26. The method of claim 20, wherein the epitaxial growth of silicon is performed at a pressure between about 10 Torr and about 80 Torr using a silicon source gas containing dichlorsilane, a hydrochloric acid gas, and hydrogen gas at temperature between about 750° C. and about 950° C.

27. The method of claim 20, wherein the silicon source layer is formed to a thickness of about 200 Angstroms.

28. The method of claim 27, wherein the silicon source layer is formed to a thickness between about 20 Angstroms and about 100 Angstroms.

29. The method of claim 20, wherein in forming the gate, a conductive layer is anisotropically etched until the gate oxide is exposed.

30. The method of claim 20, wherein in forming the gate, a conductive layer is anisotropically etched until the semiconductor substrate below the gate oxide is exposed.

31. A method of fabricating a gate of a semiconductor device, the method comprising:

forming a gate oxide layer on a semiconductor substrate;

forming a gate containing silicon on the gate oxide layer;

forming a silicon source layer on an exposed sidewall of the gate; and not forming the silicon source layer on an exposed sidewall of the gate oxide;

wherein in forming the gate, a conductive layer is anisotropically etched until the gate oxide is exposed; and wherein the silicon source layer is epitaxially grown from the semiconductor substrate exposed.

* * * * *